United States Patent
Ryu et al.

(10) Patent No.: US 10,310,643 B2
(45) Date of Patent: Jun. 4, 2019

(54) TOUCH PANEL AND JUNCTION STRUCTURE OF TOUCH PANEL AND FLEXIBLE PRINTED CIRCUIT BOARD

(71) Applicant: Dongwoo Fine-Chem Co., Ltd., Jeollabuk-do (KR)

(72) Inventors: Han Sub Ryu, Gyeongsangbuk-do (KR); Yong Soo Park, Gyeonggi-do (KR); Euk Kun Yoon, Gyeonggi-do (KR)

(73) Assignee: Dongwoo Fine-Chem Co., Ltd., Jeollabuk-Do (KR)

( * ) Notice: Subject to any disclaimer, the term of this patent is extended or adjusted under 35 U.S.C. 154(b) by 205 days.

(21) Appl. No.: 15/466,449

(22) Filed: Mar. 22, 2017

(65) Prior Publication Data

US 2017/0285779 A1 Oct. 5, 2017

(30) Foreign Application Priority Data

Mar. 31, 2016 (KR) .................. 10-2016-0039512

(51) Int. Cl.
*H05K 1/18* (2006.01)
*G06F 3/041* (2006.01)
(Continued)

(52) U.S. Cl.
CPC .............. *G06F 3/041* (2013.01); *G06F 3/044* (2013.01); *G06F 3/0416* (2013.01); *H05K 1/117* (2013.01);
(Continued)

(58) Field of Classification Search
CPC ........ G06F 3/041; G06F 3/0416; G06F 3/044; G06F 2203/04102; H05K 1/18;
(Continued)

(56) References Cited

U.S. PATENT DOCUMENTS

| 2015/0130763 A1* | 5/2015 | Park | G06F 3/041 345/174 |
| 2017/0177148 A1* | 6/2017 | Lee | G06F 3/044 |

FOREIGN PATENT DOCUMENTS

| KR | 10-2015-0000383 | 1/2015 |
| KR | 10-2016-0007060 | 1/2016 |
| KR | 101586736 | 1/2016 |

OTHER PUBLICATIONS

Notification of Grounds for Rejection from corresponding Korean Patent Appln. No. 10-2016-00039512 dated Dec. 20, 2017, and its English translation.

* cited by examiner

*Primary Examiner* — Chuong A Luu
(74) *Attorney, Agent, or Firm* — DLA Piper LLP (US)

(57) ABSTRACT

A touch panel includes: an adhesive layer formed on a base film; a protective layer formed on the adhesive layer; a touch sensor portion formed on the protective layer; a bonding pad portion comprising a plurality of unit bonding pads formed on the protective layer as electrically connected to the touch sensor portion; and a first insulating layer formed on the protective layer to extend from a unit bonding pad while filling separation regions between the unit bonding pads. Since the deformations in the elements of the touch panel during the process of bonding the touch panel and the flexible printed circuit board are prevented, there are effects that the degradation in the performance of the touch panel is prevented, and the structural stability of the junction structure of the touch panel and the flexible printed circuit board is secured.

16 Claims, 7 Drawing Sheets

(51) Int. Cl.
*G06F 3/044* (2006.01)
*H05K 1/11* (2006.01)
*H05K 3/36* (2006.01)

(52) U.S. Cl.
CPC ... *H05K 1/189* (2013.01); *G06F 2203/04102* (2013.01); *H05K 3/361* (2013.01); *H05K 2201/0108* (2013.01); *H05K 2201/09436* (2013.01); *H05K 2201/09472* (2013.01); *H05K 2201/10136* (2013.01); *H05K 2201/10151* (2013.01)

(58) Field of Classification Search
CPC ........ H05K 1/117; H05K 1/189; H05K 3/361; H05K 2201/0108; H05K 2201/09436; H05K 2201/09472; H05K 2201/10136; H05K 2201/10151
USPC ........................................................ 257/414
See application file for complete search history.

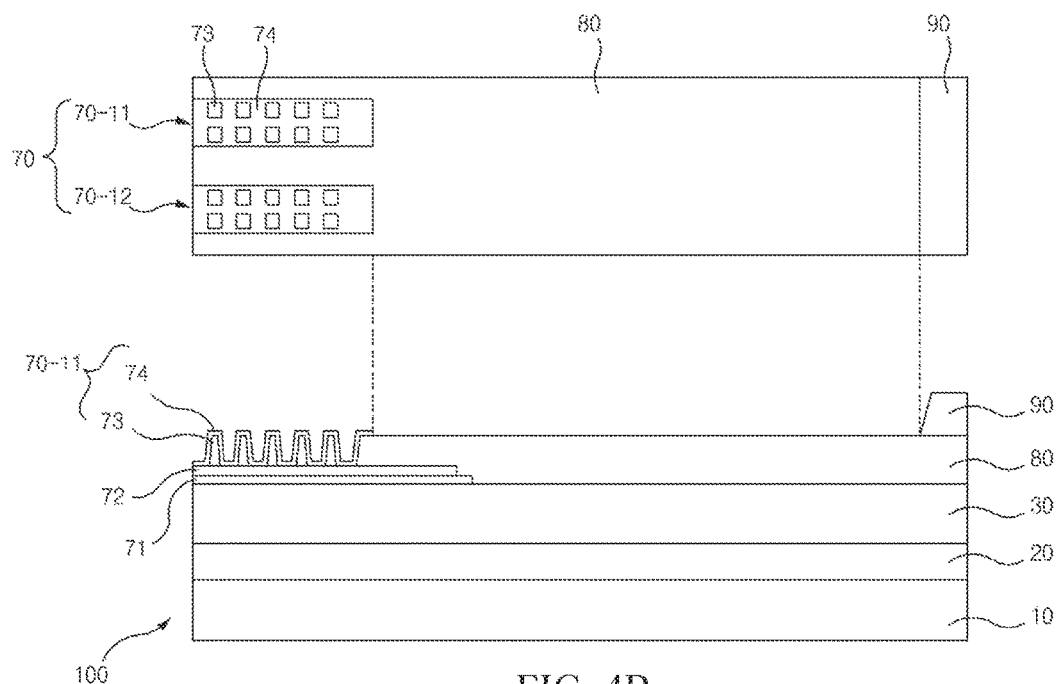

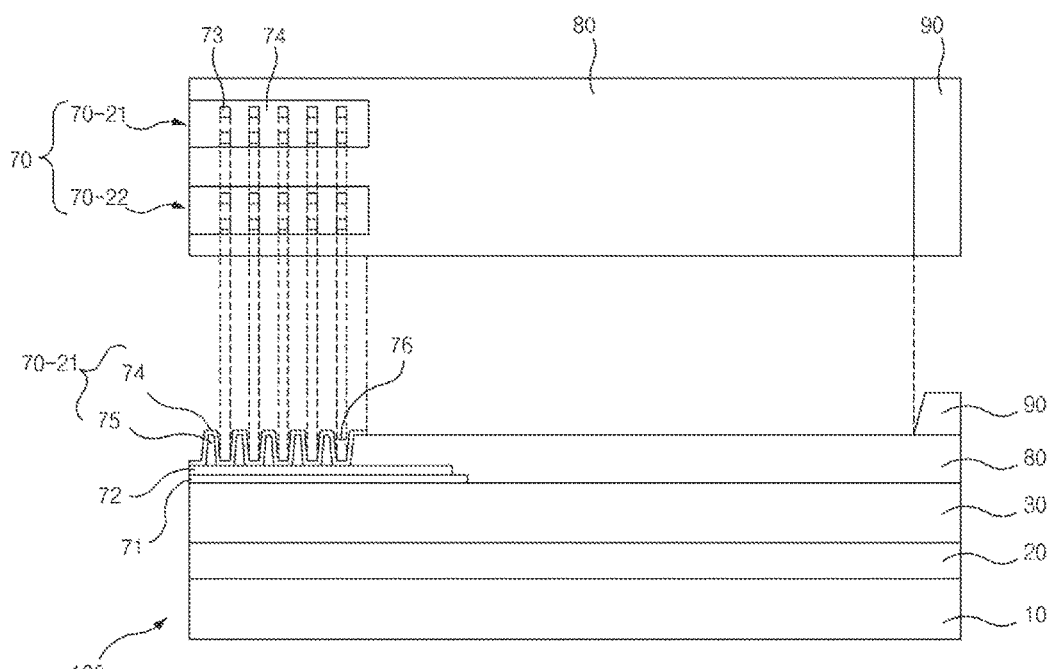

TOUCH PANEL AND JUNCTION STRUCTURE OF TOUCH PANEL AND FLEXIBLE PRINTED CIRCUIT BOARD

CROSS-REFERENCE TO RELATED PATENT APPLICATION

This U.S. non-provisional patent application claims priority under 35 U.S.C. § 119 of Korean Patent Application No. 10-2016-0039512 filed on Mar. 31, 2016 in the Korean Patent Office, the entire contents of which are hereby incorporated by reference.

BACKGROUND

1. Technical Field

The present invention relates to a touch panel and a junction structure of the touch panel and a flexible printed circuit board. More particularly, the present invention relates to a technology capable of preventing the deformations in the elements of the touch panel during the process of jointing the touch panel and the flexible printed circuit board so that degradation in the performance of the touch panel is prevented, and the structural stability of the junction structure of the touch panel and the flexible printed circuit board is secured.

2. Description of the Related Art

Touch panel is an input device capable of inputting user's commands by selecting the instructions displayed on a screen of an image display device and the like with human hand, pen, or the like, and recently adopted in various information processing devices. Such touch panel has advantages of easy manipulation and low malfunction, and enhances portability of the product since it is integrally manufactured with the image display device.

Touch panel can be classified into a resistive film type, an electrostatic capacitive type, a surface ultrasonic wave type, an infrared type, and the like, and above all, the resistive type and the electrostatic capacitive type are mostly used.

The resistive film type comprises a laminated pair of circuit boards coated with transparent electrodes, and when the upper and the lower electrode layers are touched together by applying a pressure with a finger, a pen, or the like, an electrical signal is generated and the position is recognized thereby.

In case of such resistive film type, although it has advantages of lower price, high detection accuracy, and excellent suitability in miniaturization, there is a difficulty in manufacturing it durably since touch is recognized only if the pair of substrates is physically contacted.

Meanwhile, the electrostatic capacitive type uses a transparent substrate coated with a thin conductive material; when a user touches the surface of the coated transparent substrate while a certain amount of current is flowing over the surface of the transparent substrate, a certain amount of the current is absorbed inside the body of the user, then the position of the contacted surface where the amount of current is changed is recognized, thereby verifying the position being touched.

Meanwhile, generally the touch panel is bonded to a flexible printed circuit board with an anisotropic conductive film (ACP) as an intermediate, and many problems related to such bonding are occurring, and hereinafter such problems will be described with reference to FIGS. 1 and 2.

FIG. 1 is a plan view of a touch panel of the prior art, and FIGS. 2A and 2B is a top and side view of a junction structure of the touch panel of the prior art and a flexible printed circuit board.

Referring to FIGS. 1 and 2, a touch panel 110 of the prior art comprises: an adhesive layer 22 formed on a base film 10, a protective layer 30 formed on the adhesive layer 22, a touch sensor portion 40 formed on the protective layer 30, a connecting line portion 50, and a bonding pad portion 77.

The touch sensor portion 40 performs the function of detecting the touch signal inputted from the user; the line connecting portion 50 performs a function of electrically connecting the touch sensor portion 40 and the bonding pad portion 77; and the bonding pad portion 77 is bonded to a flexible printed circuit board 200 with an anisotropic conductive film 310 as an intermediate. The touch signal detected by the touch sensor portion 40 is transferred to the driving unit which is not shown here via the flexible printed circuit board 200. In the bonding pad portion 77, a plurality of unit bonding pads 77-1 and 77-2 which are respectively and electrically connected to the connecting lines constituting the connecting line portion 50 are provided. The numerical symbols 75 and 77-1 in FIG. 2 are indium tin oxide (ITO), and the numerical symbol 76 is a metal layer, and these are formed in the lower side of the bonding pad portion 77 in the process of forming the touch sensor portion 40. Particularly, the ITO formed on the upper side performs a function of a unit bonding pad 77-1 constituting the bonding pad portion 77.

In the process of bonding the flexible printed circuit board 200 to the touch panel 110 of the prior art using an anisotropic conductive film 310, a method is adopted, wherein the bonding region of the flexible printed circuit board 200 located in the upper side of the bonding pad portion 77 is pressed using a pressurizing means while the anisotropic conductive film 310 and the flexible printed circuit board 200 is disposed above the bonding pad portion 77.

Meanwhile, an insulating layer 82 and a protective layer 92 having considerable thicknesses are formed in the side surface of the bonding pad portion 77 which is an area to be pressed, and since both of these insulating layer 82 and the protective layer 92 are pressed during the bonding process, a problem occurs that the elements located in the lower side of the insulating layer 82 and the protective layer 92 affected by the insulating layer 82 and the protective layer 92.

Especially, as disclosed in FIG. 2, since the thickness of the adhesive layer 22 located beneath the insulating layer 82 and the protective layer 92 becomes very thin, a problem occurs that the bonding strength between the base film 10 and the protective layer 30 becomes very weak.

PATENT LITERATURE

Korea Unexamined Patent Publication No. 2016-0007060 (Publication Date: Jan. 20, 2016, titled as "Touch screen device and manufacturing method thereof")

SUMMARY

A technical objective of the present invention is to prevent deformations in the elements of the touch panel during the process of bonding the touch panel and the flexible printed circuit board so that the degradation in the performance of the touch panel is prevented, and the structural stability of the junction structure of the touch panel and the flexible printed circuit board is secured.

Another technical objective of the present invention is to maintain the thickness of the adhesive layer located beneath the bonding area uniformly during the process of bonding the touch panel and the flexible printed circuit board so that the structural stability of the touch panel and the junction structure of the touch panel and the flexible printed circuit board is secured.

A touch panel according to the present invention comprises: an adhesive layer formed on a base film; a protective layer formed on the adhesive layer; a touch sensor portion formed on the protective layer; a bonding pad portion comprising a plurality of unit bonding pads formed on the protective layer as electrically connected to the touch sensor portion; and a first insulating layer formed on the protective layer in a way that it is extended from a unit bonding pad while filling the separation region between the unit bonding pads.

In the touch panel according to the present invention, the unit bonding pads is characterized in that and comprises: a plurality of insulating columns having a height corresponding to the first insulating layer; and a transparent conductive layer formed on the insulating columns.

In the touch panel according to the present invention, the unit bonding pads is characterized in that and comprise: an insulating pattern portion having a height corresponding to the first insulating layer and formed with a plurality of holes; and a transparent conductive layer formed in the holes and the insulating pattern portion.

The touch panel according to the present invention is characterized in that the height difference between the unit bonding pads and the first insulating layer is practically same as the height of the transparent conductive layer.

The touch panel according to the present invention is characterized in that the first insulating layer and the insulating columns constituting the unit bonding pads are formed through the same process.

The touch panel according to the present invention is characterized in that the entire area of the unit bonding pads and a partial area of the first insulating layer which is extended from the unit bonding pads are the bonding region to where a flexible printed circuit board (FPCB) is bonded.

The touch panel according to the present invention is characterized in that the entire area of the unit bonding pads and a partial area of the first insulating layer which is extended from the unit bonding pads are bonded to a flexible printed circuit board with an anisotropic conductive film (ACF) or an anisotropic conductive material layer as an intermediate.

The touch panel according to the present invention is characterized in that it further comprises a second insulating layer formed at the periphery of the first insulating layer in a way that it is spaced apart from the unit bonding pads.

A junction structure of a touch panel and a flexible printed circuit board according to the present invention comprises: a touch panel; a flexible printed circuit board (FPCB); and a bonding portion for bonding the touch panel and the flexible printed circuit board, wherein the touch panel comprises: an adhesive layer formed on a base film; a protective layer formed on the adhesive layer; a touch sensor portion formed on the protective layer; a bonding pad portion comprising a plurality of unit bonding pads formed on the protective layer while it is electrically connected to the touch sensor portion; and a first insulating layer formed on the protective layer in a way that it is extended from the unit bonding pads filling the gap between the unit bonding pads, wherein the flexible printed circuit board is bonded to the bonding pad portion of the touch panel with the bonding portion as an intermediate.

The junction structure of a touch panel and a flexible printed circuit board according to the present invention is characterized in that the unit bonding pad comprises: a plurality of insulating columns having a height corresponding the first insulating layer; and a transparent conductive layer formed on the insulating columns.

The junction structure of a touch panel and a flexible printed circuit board according to the present invention is characterized in that the unit bonding pad comprises: an insulating pattern portion having a height corresponding to the first insulating layer wherein a plurality of holes are formed; and a transparent conductive layer formed in the holes and the insulating pattern portion.

The junction structure of a touch panel and a flexible printed circuit board according to the present invention is characterized in that the height difference between the unit bonding pads and the first insulating layer is practically same as the thickness of the transparent conductive layer.

The junction structure of a touch panel and a flexible printed circuit board according to the present invention is characterized in that the first insulating layer and the insulating columns included in the unit bonding pads are formed through the same process.

The junction structure of a touch panel and a flexible printed circuit board according to the present invention is characterized in that the entire area of the unit bonding pads and a partial area of the first insulating layer which is extended from the unit bonding pads are bonded to the flexible printed circuit board with the bonding portion as an intermediate.

The junction structure of a touch panel and a flexible printed circuit board according to the present invention is characterized in that the bonding portion comprises an anisotropic conductive film (ACF) or an anisotropic conductive material layer.

The junction structure of a touch panel and a flexible printed circuit board according to the present invention is characterized in that it further comprises a second insulating layer formed at the periphery of the first insulating layer in a way that it is spaced apart from the unit bonding pads.

According to the present invention, since the deformations in the elements of the touch panel during the process of bonding the touch panel and the flexible printed circuit board are prevented, there are effects that the degradation in the performance of the touch panel is prevented, and the structural stability of the junction structure of the touch panel and the flexible printed circuit board is secured.

In addition, since the thickness of the adhesive layer located beneath the bonding area is maintained uniformly during the process of bonding the touch panel and the flexible printed circuit board, there are effects that the structural stability of the junction structure of the touch panel and the flexible printed circuit board is secured.

BRIEF DESCRIPTION OF DRAWINGS

FIG. 4A is a top view of a touch panel according to the first exemplary embodiment of the present invention;

FIG. 4B is a side view of a touch panel according to the first exemplary embodiment of the present invention;

FIG. 5A is a top view of a touch panel according to the second exemplary embodiment of the present invention;

FIG. 5B is a side view of a touch panel according to the second exemplary embodiment of the present invention;

DETAILED DESCRIPTION OF EMBODIMENTS

Figure 1:
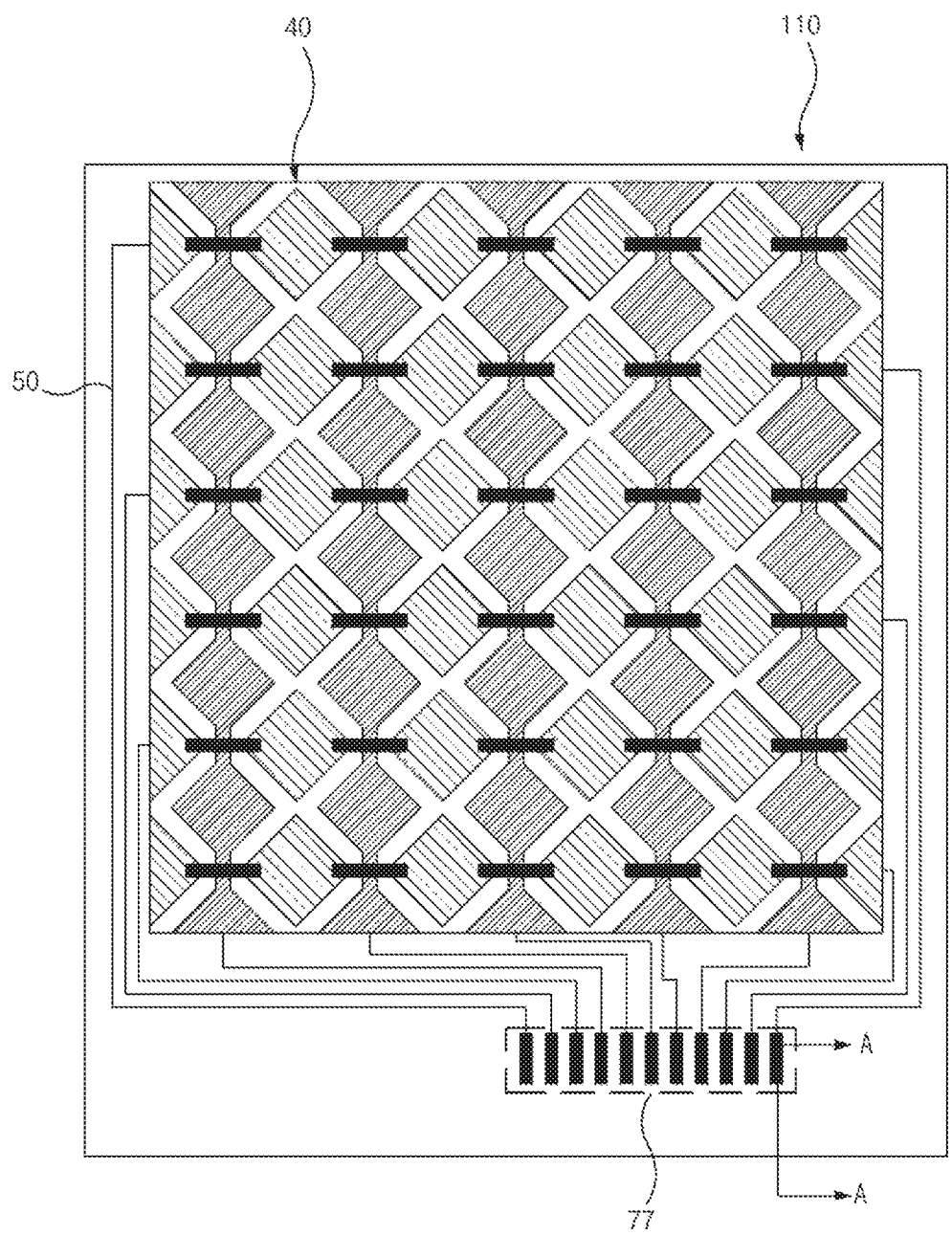
FIG. 1 is a plan view of a touch panel of the prior art.

As specific structural or functional descriptions for the embodiments according to the concept of the invention disclosed herein are merely exemplified for purposes of describing the embodiments according to the concept of the invention, the embodiments according to the concept of the invention may be embodied in various forms but are not limited to the embodiments described herein.

While the embodiments of the present invention are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a preferred exemplary embodiment of the present invention will be described in detail with reference to the accompanying drawings.

Figure 3:
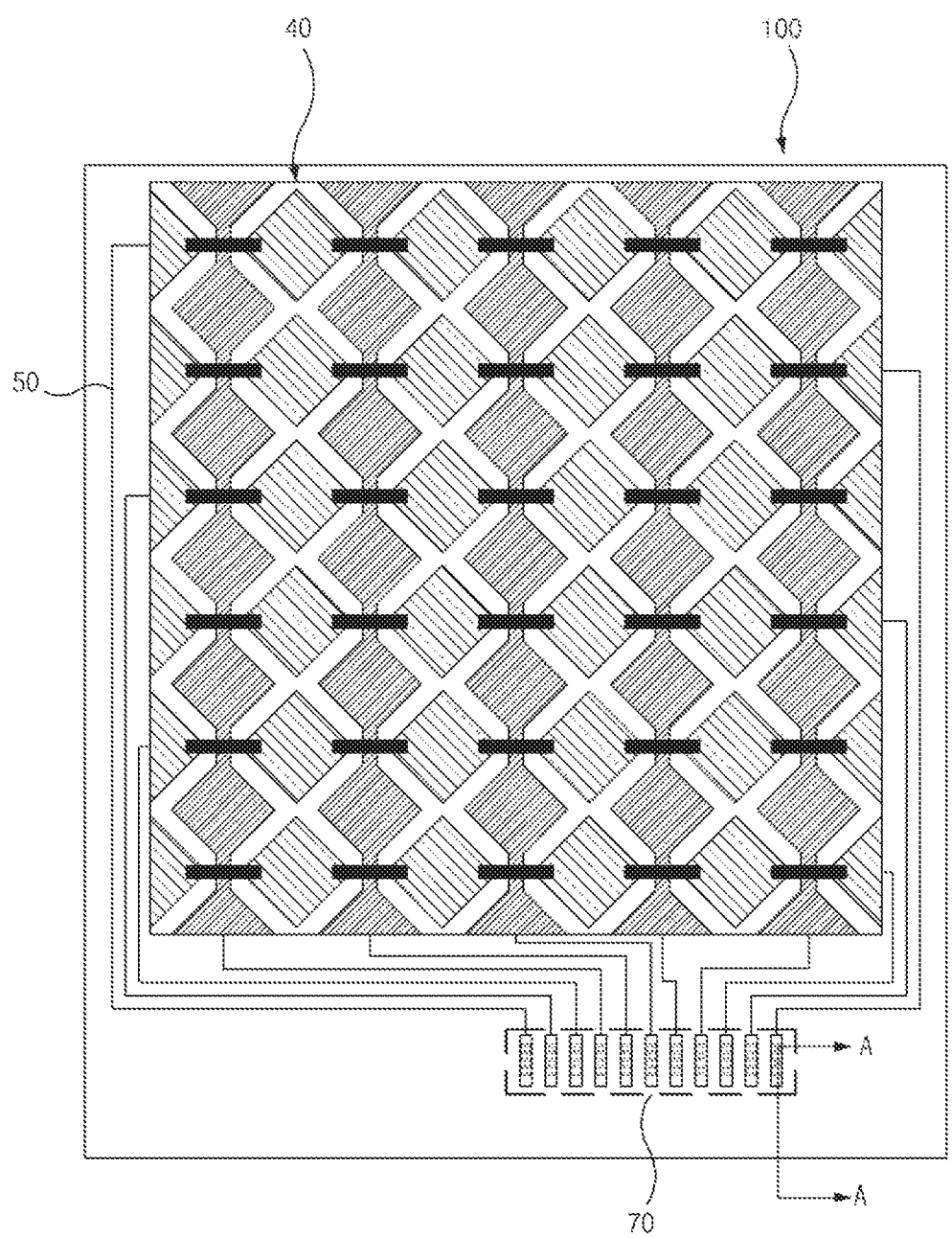
FIG. 3 is a plan view of a touch panel according to the exemplary embodiments of the present invention.

FIG. 3 is a plan view of a touch panel according to the exemplary embodiments of the present invention, and FIGS. 4A and 4B is a top and side view of a touch panel according to the first exemplary embodiment of the present invention.

Referring to FIGS. 3 and 4, a touch panel 100 according to the first exemplary embodiment of the present invention comprises: a base film 10; an adhesive layer 20; a protective layer 30; a touch sensor portion 40; a connecting line portion 50, a bonding pad portion 70; a first insulating layer 80; and a second insulating layer 90. Among these elements, the base film 10, the connecting line portion 50, and the second insulating layer 90 are not essential elements, but included for the sake of easy explanation, and they can be added or excluded depending on the necessity of a separate function.

The base film 10 is bonded to the protective layer 30 with the adhesive layer 20 as an intermediate, and performs the function as a base of the touch panel 100 according to the first exemplary embodiment of the present invention.

For example, the base film 10 may be a transparent optical film or a polarizer.

A film having superior transparency, mechanical strength, and thermal stability can be used as a transparent optical film, and for a specific example, a thermoplastic resin film comprising any one of polyester series resin such as polyethylene terephthalate, poly(ethylene isophthalate), polyehtylenenaphthalate, polybutyleneterephtalate, and the like; cellulose series resin such as diacetyl cellulose, cellulose triacetate, and the like; polycarbonate series resin; acrylic series resin such as polymethyl(metha)acrylate, polyethyl(metha)acrylate, and the like; styrene series resin such as polystyrene, acrylonitrile styrene copolymer, and the like; polyolefin series resin such as polyethylene, polypropylene, cyclo-based or norbornene-polyolefin, ethylene-polypropylene copolymer, and the like; vinyl chloride series resin; amide series resin such as nylon, aromatic polyamide, and the like; imide series resin; polyethersulfone series resin; sulfone series resin; polyether ether ketone-series resin; polyphenylene sulfide series resin; vinyl alcohol-series resin; polyvinylidene chloride series resin; vinyl butyral series-resin; arylate-series resin; polyoxymethylene resin; and epoxy series resin, and the like can be used, and also a film comprising a blend material using the above mentioned thermoplastic resins may be used. Also, a film comprising a thermosetting resin selected from (metha) acrylic series, urethane series, acrylic urethane series, epoxy series, silicon series, and the like; or a UV curing type resin can be used. The thickness of such transparent optical film may be determined as appropriately, however, in general, it can be determined to be between 1 μm and 500 μm considering the strength, the workability, and the thin layer property thereof.

Particularly, a value between 1 µm and 300 µm is preferred, and a value between 5 µm and 200 µm is more preferred.

Such transparent optical film may contain one or more types of additives as appropriately. As for additives, for example, there are UV absorbents, antioxidants, lubricants, plasticizers, release agents, anti-coloring agents, flame retardants, epispastic agents, anti-static agents, pigments, coloring agents, and the like. A transparent optical film may have a structure wherein various functional layers such as hard coating layers, anti-reflective layers, gas barrier layers, and the like are deposited on one or both side surfaces thereof, and the functional layers are not limited to the above mentioned ones but may include various functional layers depending on the usage.

Also, the transparent optical film may be surface treated as necessary. Such surface treatment may be a dry process treatment such as plasma treatment, corona treatment, primer treatment, and the like, or a chemical treatment such as alkaline treatment including hydrosis treatment and the like.

Also, the transparent optical film may be an anisotropic film or a phase difference film.

For a case of an isotropic film, the in-plane phase difference $R_o$ {$R_o=(n_x-n_y)\times d$, where $n_x$ and $n_y$ are the major refractive indices within the film plane, $n_z$ is the refractive index along the thickness direction, and d is the film thickness} is no more than 40 nm, and preferably, no more than 15 nm, and the phase difference along the thickness direction $R_{th}$ [$R_{th}=\{(n_x+n_y)/2-n_z\}\times d$, where $n_x$ and $n_y$ are the major refractive indices within the film plane, $n_z$ is the refractive index along the thickness direction, and d is the film thickness] is between −90 nm and +75 nm, preferably between −80 nm and +60 nm, and more preferably between −70 nm and +45 nm.

The phase difference film is manufactured through the processes of uniaxial elongation, biaxial elongation, polymer coating, and liquid crystal coating of a polymer film, and it is generally used for enhancement and adjustment of the optical property of a display such as viewing angle compensation, color sensitivity improvement, color taste adjustment, and the like. As for the types of phase difference film, there are wave plates such as half-wave plates, quarter-wave plates, positive C-plates, negative C-plates, positive A-plates, negative A-plates, biaxial wave plates, and the like.

A publicly known polarizing plate being used in the display panel can be used as a polarizing plate herein.

Specifically, the one made of a polarizer which is an elongated poly vinyl alcohol film dyed with iodine or dichroic pigment wherein a protective layer 30 is installed in at least one surface thereof; the one made to obtain a property of polarizer by orienting liquid crystals; and the one made through elongating and dyeing a transparent optical film coated with an oriented resin like polyvinyl alcohol and the like can be taken as examples, and it is not limited these examples.

The adhesive layer 20 performs the role of bonding the base film 10 and the protective layer 30.

As a material for the adhesive layer 20, photo-curing adhesives, water-based adhesives, organic adhesives, and the like can be used but not limited to these.

A photo-curing adhesive is an adhesive being cured when illuminated by light such as a UV light. Since the photo-curing adhesive does not require a separate drying process after photo-curing, the manufacturing process becomes simple, thereby enhancing the productivity.

For example, as a photo-curing adhesive, a radical copolymer-type containing acrylate, unsaturated polyester, and the like as its major contents; and a positive ion copolymer containing epoxy, oxetane, vinyl ether, and the like as its major components, can be used.

The protective layer 30 is bonded to the base film 10 with the adhesive layer 20 as an intermediate, and performs a function as a base material wherein the elements of the touch sensor portion 40 and the bonding pad portion 70 are formed.

As a material of the protective layer 30, polymers publicly known in the art may be used without limitation, for example, an organic insulating film may be applied, and above all, it may be formed with a curable composite containing a polyol and a melamine curing agent, but not limited to these examples.

As for the specific types of polyol, polyether glycol derivatives, polyester glycol derivatives, polycaprolactone glycol derivatives, and the like can be taken as examples thereof, but not limited to these examples.

As for the specific types of melamine curing agent, methoxy methyl melamine derivatives, methyl melamine derivatives, butyl melamine derivatives, isobutoxy melamine derivatives, butoxy melamine derivatives, and the like can be taken as examples thereof, but not limited to these examples.

As for other example, the protective layer 30 can be formed with organo-inorgano hybrid curable composites, and using both organic compound and inorganic compound is desirable in that the cracks occurring while peeling off can be reduced.

As for an organic compound, the above described components can be used, and as for an inorganic material, silica based nano particles, silicon based nano particles, glass nano fibers, and the like can be taken as examples thereof, but not limited to these examples.

The touch sensor portion 40 is formed on the protective layer 30, and performs a function of detecting touch signal inputted from the user.

For example, the touch sensor portion 40 may comprise: a first transparent conductive pattern, a second transparent conductive pattern, an insulating layer, and a bridge pattern.

The first transparent conductive pattern may be formed along a first direction as it is being electrically connected to each other, and the second transparent pattern may be formed along a second direction as the unit cells are electrically separated from each other, and the second direction may be a direction crossing the first direction. For example, if the first direction is an x direction, the second direction could be a y direction.

The insulating layer may be formed between the first transparent conductive pattern and the second transparent conductive pattern, and it electrically isolates the first transparent conductive pattern and the second transparent conductive pattern.

The bridge pattern electrically connects the neighboring second transparent conductive patterns.

As for the first and the second transparent conductive layers, any transparent material can be used without limitation, for example, it can be formed with materials selected from: metal oxides selected from the group comprising indium tin oxide (ITO), indium zinc oxide (IZO), indium zinc tin oxide (IZTO), aluminum zinc oxide (AZO), gallium zinc oxide (GZO), fluorine tin oxide (FTO), indium tin oxide-Ag-indium tin oxide (ITO-Ag-ITO), indium zinc oxide-Ag-indium zinc oxide (IZO-Ag-IZO), indium zinc tin oxide-Ag-indium zinc tin oxide (IZTO-Ag-IZTO), and aluminum zinc oxide-Ag-aluminum zinc oxide (AZO-Ag-AZO); metals selected from the group comprising gold (Au), silver (Ag), molybdenum (Mo), and APC; nano wires made of metal selected from the group comprising gold, silver, copper, and lead; carbon based materials selected from the group comprising carbon nano tube (CNT) and grapheme; and conductive polymer materials selected from the group comprising poly(3,4-ethylenedioxitiophene) (PEDOT) and polyaniline (PANI), and these can be used individually or in a mixture of more than two of them, and preferably, indium tin oxide may be used. Both a crystalline and a non-crystalline indium tin oxide are usable.

For example, the first and the second transparent conductive patterns may be polygonal patterns that are independent to each other and in the form of a triangle, a rectangle, a pentagon, a hexagon, a heptagon or more.

Also, for example, the first and the second transparent conductive patterns may include a regular pattern. A regular pattern means that the shape of the pattern contains regularity therein. For example, the detecting patterns may contain a mesh type pattern comprising such as rectangles or squares independent from each other, or a pattern comprising such as hexagons.

Also, for example, the first and the second transparent conductive patterns may include an irregular pattern. An irregular pattern means that the shape of the pattern contains irregularity therein.

Also, for example, when the detection patterns constituting the first and the second transparent conductive patterns are formed with carbon based materials, polymer based materials, and the like, the detection patterns may have a network type structure. When the detection patterns have a network type structure, since signals are sequentially transferred to the neighboring patterns contacted to each other, patterns having a high sensitivity can be implemented.

For example, the first and the second transparent conductive patterns may be formed to have a single-layer structure or a stacked-layer structure.

As for a material of the insulating layer for insulating the first and the second transparent conductive patterns, any insulating material known to the art may be used without limitation, for example, metal oxides like silicon based oxides, photosensitive resin composites containing metal oxides or acrylic resins, or thermoplastic resin composites may be used. Or, the insulating layer may be formed using inorganic materials such as silicon oxides (SiOx), and in this case, they can be formed using methods such as vacuum evaporation, sputtering, and the like.

The connecting line portion 50 performs the function of electrically connecting the touch sensor portion 40 and the bonding pad portion 70. For example, the connecting line portion 50 can be configured in a way that each of the patterns constituting the first and the second transparent conductive patterns is electrically connected to each of the unit bonding pads 70-11 and 70-12 respectively.

The bonding pad portion 70 comprises a plurality of unit bonding pads 70-11 and 70-12 formed on the protective layer 30 as it is being electrically connected to the touch sensor portion 40 with the connecting line portion 50 as an intermediate.

For example, the unit bonding pads 70-11 and 70-12 may comprise a plurality of insulating columns 73 having a height corresponding to a first insulating layer 80 and a conductive layer 74 formed in a plurality of insulating columns 73. When configured in this way, since the height difference between the unit bonding pads 70-11 and 70-12 and the first insulating layer 80, the bonding property between the bonding pad portion 70 comprising the unit bonding pads 70-11 and 70-12 and a flexible printed circuit board, which is not shown here, is enhanced.

The first insulating layer 80 is formed on the protective layer 30 filling the separation region between the unit bonding pads 70-11 and 70-12 and being extended from the unit bonding pads 70-11 and 70-12.

For example, in order to reduce processing time and the number of required processes, the first insulating layer 80 and the insulating columns 73 contained in the unit bonding pads 70-11 and 70-12 can be configured to be formed through the same process.

For example, the height difference between the unit bonding pads 70-11 and 70-12 and the first insulating layer 80 can be configured to be practically same as the thickness of the conductive layer 74; the second insulating layer 90 can be configured to be formed in the periphery of the first insulating layer 80 so as to be spaced apart from the unit bonding pads 70-11 and 70-12; and the entire region of the unit bonding pads 70-11 and 70-12 and a portion of the first insulating layer 80 extended from the unit bonding pads 70-11 and 70-12 can be configured to be the bonding region for bonding with a flexible printed circuit board (FPCB), and for example, an anisotropic conductive film (ACF) or an isotropic conductive material layer can be configured to be used as a specific bonding means.

The effects according to such configuration can be compared with the prior art as follows.

Figures 2A, 2B:
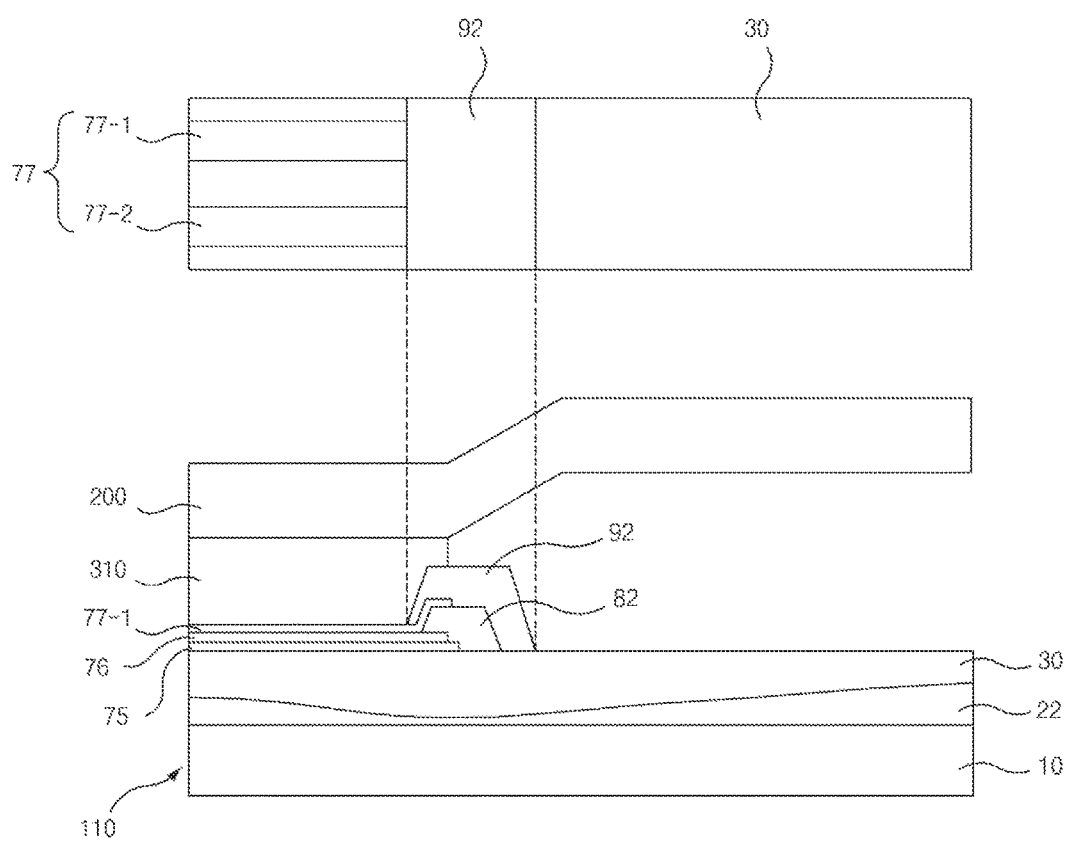
FIG. 2A is a top view of a junction structure of a touch panel and a flexible printed circuit board according to the prior art.
FIG. 2B is a side view of a junction structure of a touch panel and a flexible printed circuit board according to the prior art.

Referring to FIG. 2, in the process of bonding a flexible printed circuit board 200 to a touch panel 110 of the prior art using an anisotropic conductive film 310 according to the prior art, a method is used wherein the bonding region of the flexible printed circuit board 200 located in the upper side of the bonding pad portion 77 is pressed by using a pressing means while the anisotropic conductive film 310 and the flexible printed circuit board 200 are being disposed on the upper side of the bonding pad portion 77. In the touch panel 110 of the prior art, an insulating layer 82 and a protective layer 92 having a considerable thickness are formed in the side surfaces of the bonding pad portion 77 which is the region to be pressed, and since the insulating layer 82 and the protective layer 92 are pressed together in the bonding process, a problem occurs that the elements located beneath the insulating layer 82 and the protective layer 92 are deformed, affected by the insulating layer 82 and the protective layer 92. Especially, as disclosed in FIG. 2, a problem occurs that since the thickness of an adhesive layer 22 located beneath the insulating layer 82 and the protective layer 92 becomes very thin, the bonding strength between the base film 10 and the protective layer 30 becomes very weak.

However, the touch panel 100 according to the first exemplary embodiment of the present invention, the entire region of the unit bonding pads 70-11 and 70-12 and a portion of the first insulating layer 80 extended from the unit bonding pads 70-11 and 70-12 becomes a bonding region to where a flexible printed circuit board is bonded, and since only the height difference practically corresponding to the thickness of the conductive layer 74 exists in the bonding region, even the bonding region is pressed during the bonding process, the thickness of the elements located beneath thereof, especially the thickness of the adhesive layer 20 is uniformly maintained, so there is an effect that the structural stability of the junction structure of the touch panel 100 and the flexible printed circuit board 200 as well as the touch panel 100 is secured.

A first transparent conductive layer 71 and a metal pattern 72 can be formed in the process wherein the touch sensor portion 40 is formed. Also, the conductive layer 74 formed on the insulating columns 73 can be formed simultaneously in the process wherein the touch sensor portion 40 is formed, and it may also be named as a second transparent conductive layer 74 according to the order of formation. For example, the first transparent conductive layer 71 and the second transparent conductive layer 74 could be a transparent conductive material such as an ITO and the like.

FIG. 3 is a plan view of a touch panel according to the exemplary embodiments of the present invention; and FIGS. 5A and 5B is a top and side view of a touch panel according to the second exemplary embodiment of the present invention.

Referring to FIGS. 3 and 5, a touch panel according to the second exemplary embodiment of the present invention is different from the first exemplary embodiment in the configuration of the unit bonding pads 70-21 and 70-22, and hereinafter, the second exemplary embodiment will be described focusing on such difference therebetween. The configuration of the second exemplary embodiment is same as that of the first exemplary embodiment except such difference.

According to the second exemplary embodiment of the present invention, the unit bonding pads 70-21 and 70-22 have a thickness corresponding to the first insulating layer 80, and configured to include a insulating pattern portion 75 wherein a plurality of holes 76 are formed and the transparent conductive layer 74 formed on the holes 76 and an insulating pattern portion 75. That is, on the contrary to the first exemplary embodiment wherein the insulating columns 73 is formed, and then the transparent conductive layer 74 is formed thereon; in the second exemplary embodiment, the unit bonding pads 70-21 and 70-22 are formed in a way that the insulating pattern portion 75 having a plurality of holes 76 is formed, and then the transparent conductive layer 74 is formed in the holes 76 and the insulating pattern portion 75.

Figures 6A, 6B:
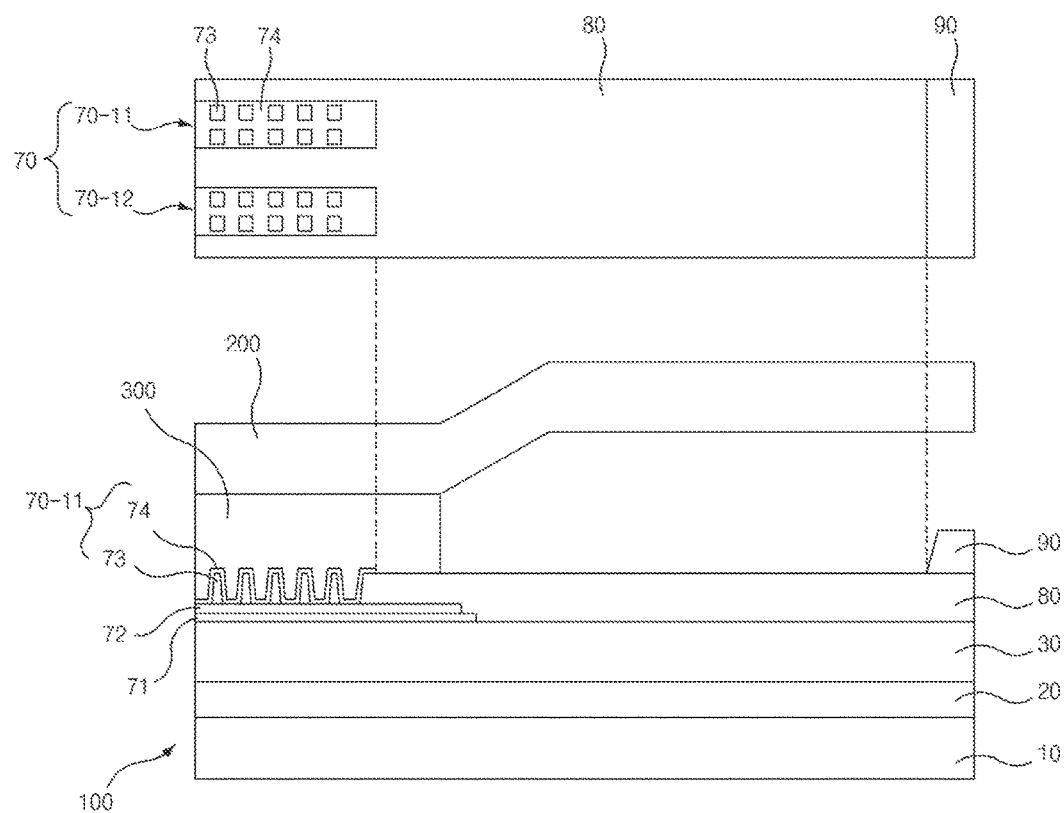
FIG. 6A is a top view of a junction structure of a touch panel and a flexible printed circuit board according to the first exemplary embodiment of the present invention.
FIG. 6B is a side view of a junction structure of a touch panel and a flexible printed circuit board according to the first exemplary embodiment of the present invention.

FIGS. 6A and 6B is a top and side view of a junction structure of a touch panel and a flexible printed circuit board according to the first exemplary embodiment of the present invention.

Referring to FIG. 6, a junction structure of a touch panel 100 and a flexible printed circuit board 200 according to the first exemplary embodiment of the present invention comprises: a touch panel 100, a flexible printed circuit board 200; and a bonding portion 300 for bonding the touch panel 100 and a flexible printed circuit board 200.

In a junction structure of a touch panel 100 and a flexible printed circuit board 200 according to the first exemplary embodiment of the present invention, the touch panel 100 comprises: an adhesive layer 20 formed on a base film 10; a protective layer 30 formed on the adhesive layer 20; a touch sensor portion 40 formed on the protective layer 30; a bonding pad portion 70 comprising a plurality of unit bonding pads 70-11 and 70-12 formed on the protective layer 30 while it is electrically connected to the touch sensor portion 40; and a first insulating layer 80 formed on the protective layer 30 in a way that it is extended from the unit bonding pads 70-11 and 70-12 filling the gap between the unit bonding pads 70-11 and 70-12. Since such touch panel 100 is same as the touch panel 100 according to the first exemplary embodiment of the present invention which had previously described in detail, the overlapping description will be omitted.

In a junction structure of a touch panel 100 and a flexible printed circuit board 200 according to the first exemplary embodiment of the present invention, the flexible printed circuit board 200 is bonded to the bonding pad portion 70 of the touch panel 100 with the bonding portion 300 as an intermediate.

For example, the height difference between the unit bonding pads 70-11 and 70-12 and the first insulating layer 80 can be configured to be practically same as the thickness of the conductive layer 74; the second insulating layer 90 can be configured to be formed in the periphery of the first insulating layer 80 so as to be spaced apart from the unit bonding pads 70-11 and 70-12; the entire region of the unit bonding pads 70-11 and 70-12 and a portion of the first insulating layer 80 extended from the unit bonding pads 70-11 and 70-12 can be configured to be bonded to the flexible printed circuit board 200 with the bonding portion 300 as an intermediate; and the bonding portion 300 may comprise an anisotropic conductive film or an isotropic conductive material layer.

Although the effect according to such configuration was previously described in the course of explaining the touch panel 100 according to the first exemplary embodiment of the present invention, its main part will be explained again as follows.

According to the touch panel 100 included in the junction structure according to the first exemplary embodiment of the present invention, the entire region of the unit bonding pads 70-11 and 70-12 and a portion of the first insulating layer 80 extended from the unit bonding pads 70-11 and 70-12 becomes a bonding region to where the flexible printed circuit board 200 is bonded, and since only the height difference practically corresponding to the thickness of the conductive layer 74 exists in the bonding region, even the bonding region is pressed during the bonding process, the thickness of the elements located beneath thereof, especially the thickness of the adhesive layer 20 is uniformly maintained, so there is an effect that the structural stability of the touch panel 100 and the junction structure of the touch panel 100 and the flexible printed circuit board 200 is secured.

A first transparent conductive layer 71 and a metal pattern 72 can be formed in the process wherein the touch sensor portion 40 is formed. Also, the conductive layer 74 formed on the insulating columns 73 can be formed simultaneously in the process wherein the touch sensor portion 40 is formed, and it may also be named as a second transparent conductive layer 74 according to the order of formation. For example, the first transparent conductive layer 71 and the second transparent conductive layer 74 could be a transparent conductive material such as an ITO and the like.

Figures 7A, 7B:
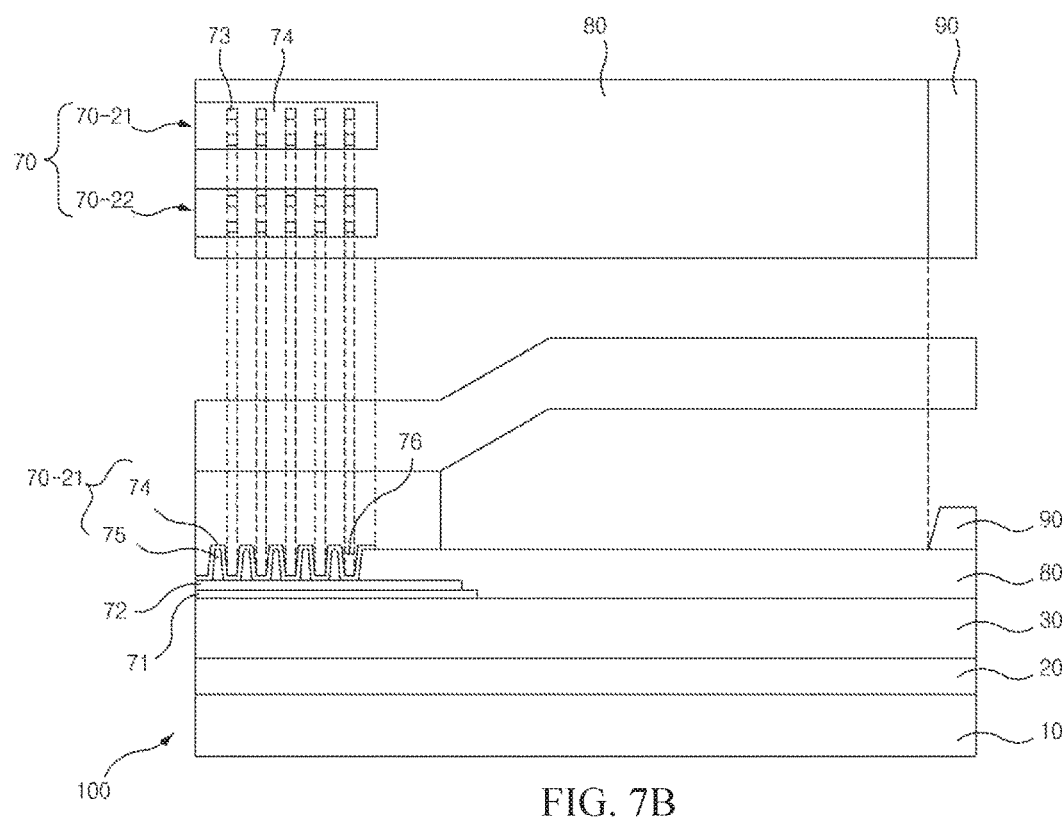
FIG. 7A is a top view of a junction structure of a touch panel and a flexible printed circuit board according to the second exemplary embodiment of the present invention.
FIG. 7B is a side view of a junction structure of a touch panel and a flexible printed circuit board according to the second exemplary embodiment of the present invention.

FIGS. 7A and 7B is a top and side view of a junction structure of a touch panel and a flexible printed circuit board according to the second exemplary embodiment of the present invention.

Referring to FIG. 7, a junction structure of a touch panel 100 and a flexible printed circuit board 200 according to the second exemplary embodiment of the present invention is different from the first exemplary embodiment in the configuration of the unit bonding pads 70-21 and 70-22, and hereinafter, the second exemplary embodiment will be described focusing on such difference therebetween. The configuration of the second exemplary embodiment is same as that of the first exemplary embodiment except such difference.

According to the second exemplary embodiment of the present invention, the unit bonding pads 70-21 and 70-22 have a thickness corresponding to the first insulating layer 80, and configured to include a insulating pattern portion 75 wherein a plurality of holes 76 are formed and the transparent conductive layer 74 formed on the holes 76 and an insulating pattern portion 75. That is, on the contrary to the first exemplary embodiment wherein the insulating columns 73 is formed, and then the transparent conductive layer 74 is formed thereon; in the second exemplary embodiment, the unit bonding pads 70-21 and 70-22 are formed in a way that the insulating pattern portion 75 having a plurality of holes 76 is formed, and then the transparent conductive layer 74 is formed in the holes 76 and the insulating pattern portion 75.

As described in detail heretofore, according to the present invention, since the deformations in the elements of the touch panel during the process of bonding the touch panel and the flexible printed circuit board are prevented, there are effects that the degradation in the performance of the touch panel is prevented, and the structural stability of the junction structure of the touch panel and the flexible printed circuit board is secured.

In addition, since the thickness of the adhesive layer located beneath the bonding area is maintained uniformly during the process of bonding the touch panel and the flexible printed circuit board, there are effects that the structural stability of the junction structure of the touch panel and the flexible printed circuit board is secured.

DESCRIPTION OF SYMBOLS

10: base film
20: adhesive layer
30: protective layer
40: touch sensor portion
50: connecting line portion
70: bonding pad portion
70-11, 70-12, 70-21, 70-22: unit bonding pad
71: first transparent conductive layer
72: metal pattern
73: insulating column
74: second transparent conductive layer
75: insulating pattern portion
76: hole
80: first insulating layer
90: second insulating layer
100: touch panel
200: flexible printed circuit board
300: bonding portion

What is claimed is:

1. A touch panel comprising:
an adhesive layer formed on a base film;
a protective layer formed on the adhesive layer;
a touch sensor portion formed on the protective layer;
a bonding pad portion comprising a plurality of unit bonding pads formed on the protective layer as electrically connected to the touch sensor portion; and
a first insulating layer formed on the protective layer to extend from the unit bonding pads while filling separation regions between the unit bonding pads,
wherein the unit bonding pad comprises a plurality of insulating columns having a height corresponding to the first insulating layer or an insulating pattern portion having a height corresponding to the first insulating layer and formed with a plurality of holes.

2. The touch panel according to claim 1, wherein the unit bonding pad comprises:
a transparent conductive layer formed on the insulating columns.

3. The touch panel according to claim 1, wherein the unit bonding pad comprises:
a transparent conductive layer formed in the holes and the insulating pattern portion.

4. The touch panel according to claim 1, wherein a height difference between the unit bonding pads and the first insulating layer is substantially same as a height of the transparent conductive layer.

5. The touch panel according to claim 1, wherein the first insulating layer and the insulating columns constituting the unit bonding pads are formed through a same process.

6. The touch panel according to claim 1, wherein an entire area of the unit bonding pads and a partial area of the first insulating layer extended from the unit bonding pads are a bonding region to where a flexible printed circuit board (FPCB) is bonded.

7. The touch panel according to claim 1, wherein an entire area of the unit bonding pads and a partial area of the first insulating layer extended from the unit bonding pads are bonded to a flexible printed circuit board with an anisotropic conductive film (ACF) or an anisotropic conductive material layer as an intermediate.

8. The touch panel according to claim 1, further comprising a second insulating layer formed at a periphery of the first insulating layer to be spaced apart from the unit bonding pads.

9. A junction structure of a touch panel and a flexible printed circuit board comprising a touch panel, a flexible printed circuit board (FPCB) and a bonding portion for bonding the touch panel and the flexible printed circuit board, wherein
the touch panel comprises:
an adhesive layer formed on a base film;
a protective layer formed on the adhesive layer;
a touch sensor portion formed on the protective layer;
a bonding pad portion comprising a plurality of unit bonding pads formed on the protective layer while it is electrically connected to the touch sensor portion; and
a first insulating layer formed on the protective layer to extend from the unit bonding pads filling gaps between the unit bonding pads, wherein
the flexible printed circuit board is bonded to the bonding pad portion of the touch panel with the bonding portion as an intermediate,
wherein the unit bonding pad comprises a plurality of insulating columns having a height corresponding to the first insulating layer or an insulating pattern portion having a height corresponding to the first insulating layer and formed with a plurality of holes.

10. The junction structure of a touch panel and a flexible printed circuit board according to claim 9, wherein
the unit bonding pad comprises:
a transparent conductive layer formed on the insulating columns.

11. The junction structure of a touch panel and a flexible printed circuit board according to claim 9, wherein
the unit bonding pad comprises:
a transparent conductive layer formed in the holes and the insulating pattern portion.

12. The junction structure of a touch panel and a flexible printed circuit board according to claim 9, wherein
a height difference between the unit bonding pads and the first insulating layer is substantially same as a thickness of the transparent conductive layer.

13. The junction structure of a touch panel and a flexible printed circuit board according to claim 9, wherein the first insulating layer and the insulating columns included in the unit bonding pads are formed through a same process.

14. The junction structure of a touch panel and a flexible printed circuit board according to claim 9, wherein
an entire area of the unit bonding pads and a partial area of the first insulating layer extended from the unit bonding pads are bonded to the flexible printed circuit board with the bonding portion as an intermediate.

15. The junction structure of a touch panel and a flexible printed circuit board according to claim 9, wherein
the bonding portion comprises an anisotropic conductive film (ACF) or an anisotropic conductive material layer.

16. The junction structure of a touch panel and a flexible printed circuit board according to claim 9, further comprising a second insulating layer formed at a periphery of the first insulating layer to be spaced apart from the unit bonding pads.

\* \* \* \* \*